(12) United States Patent
Keigler et al.

(10) Patent No.: US 10,074,554 B2
(45) Date of Patent: Sep. 11, 2018

(54) WORKPIECE LOADER FOR A WET PROCESSING SYSTEM

(71) Applicant: TEL NEXX, Inc., Billerica, MA (US)

(72) Inventors: Arthur Keigler, Wellesley, MA (US); Freeman Fisher, Charlestown, MA (US); Daniel Goodman, Lexington, MA (US)

(73) Assignee: TEL NEXX, INC., Billerica, MA (US)

( * ) Notice: Subject to any disclaimer, the term of this patent is extended or adjusted under 35 U.S.C. 154(b) by 261 days.

(21) Appl. No.: 15/193,890

(22) Filed: Jun. 27, 2016

(65) Prior Publication Data

US 2017/0372938 A1    Dec. 28, 2017

(51) Int. Cl.
| | | |
|---|---|---|
| *B65G 1/02* | (2006.01) | |
| *H01L 21/687* | (2006.01) | |
| *C25D 7/12* | (2006.01) | |
| *C25D 17/00* | (2006.01) | |
| *H01L 21/677* | (2006.01) | |

(52) U.S. Cl.
CPC .......... *H01L 21/68721* (2013.01); *C25D 7/12* (2013.01); *C25D 17/001* (2013.01); *C25D 17/005* (2013.01); *H01L 21/67784* (2013.01); *H01L 21/68742* (2013.01)

(58) Field of Classification Search
CPC ......... H01L 21/68721; H01L 21/68742; H01L 21/67784; C25D 7/12; C25D 17/001; C25D 17/005; B65G 51/02; B65G 51/03
USPC ....................................................... 414/676
See application file for complete search history.

(56) References Cited

U.S. PATENT DOCUMENTS

| | | | | |
|---|---|---|---|---|
| 3,449,102 A | * | 6/1969 | Chaumont | B65G 49/065 414/676 |
| 3,513,934 A | * | 5/1970 | Crowley | B60V 3/025 104/134 |
| 4,575,408 A | | 3/1986 | Bok | |
| 7,530,778 B2 | * | 5/2009 | Yassour | B65G 51/03 384/12 |
| 7,837,799 B2 | * | 11/2010 | Bangert | B65G 49/063 118/728 |
| 8,092,143 B2 | * | 1/2012 | Yang | B65H 5/228 271/195 |
| 8,137,046 B2 | * | 3/2012 | Kishimoto | H01L 21/67784 406/88 |

(Continued)

FOREIGN PATENT DOCUMENTS

EP    1 988 568 A1    11/2008

OTHER PUBLICATIONS

International Search Report and Written Opinion dated Sep. 28, 2017 in PCT/US2017/038188 (8 pages).

(Continued)

*Primary Examiner* — Patrick H Mackey
(74) *Attorney, Agent, or Firm* — Rothwell, Figg, Ernst & Manbeck, P.C.

(57) ABSTRACT

Techniques herein provide a workpiece handling and loading apparatus for loading, unloading, and handling relatively flexible and thin substrates for transport and electrochemical deposition. Such a system assists with workpiece holder exchange between a delivery cartridge or magazine, and a workpiece holder. Embodiments include a workpiece handler configured to provide an air cushion to a given workpiece, and maneuvering to a given workpiece holder that can edge clamp the workpiece.

20 Claims, 11 Drawing Sheets

(56) References Cited

U.S. PATENT DOCUMENTS

| | | | |
|---|---|---|---|
| 8,613,474 B2* | 12/2013 | Goodman | H01L 21/67092 |
| | | | 294/189 |
| 9,257,319 B2* | 2/2016 | Keigler | H01L 21/67028 |
| 2005/0036873 A1* | 2/2005 | Ikehata | B65G 49/063 |
| | | | 414/676 |
| 2005/0037619 A1 | 2/2005 | Granneman et al. | |
| 2007/0020080 A1 | 1/2007 | Wirth | |
| 2007/0029227 A1 | 2/2007 | Bonora | |
| 2008/0069677 A1* | 3/2008 | Kawachi | B65G 49/065 |
| | | | 414/676 |
| 2009/0130858 A1 | 5/2009 | Levy | |
| 2009/0155024 A1* | 6/2009 | Nuttgens | B65G 49/065 |
| | | | 414/150 |
| 2012/0107074 A1* | 5/2012 | Kunze | C25D 17/06 |
| | | | 414/225.01 |
| 2012/0305192 A1 | 12/2012 | Keigler et al. | |
| 2017/0121213 A1* | 5/2017 | Nitschke | B65G 51/03 |
| 2017/0370017 A1 | 12/2017 | Keigler et al. | |
| 2017/0372937 A1 | 12/2017 | Keigler et al. | |

OTHER PUBLICATIONS

Notification of Examination dated Jun. 8, 2018 in corresponding Taiwan Patent Application No. 106120822 (with an English translation) (8 pages).

\* cited by examiner

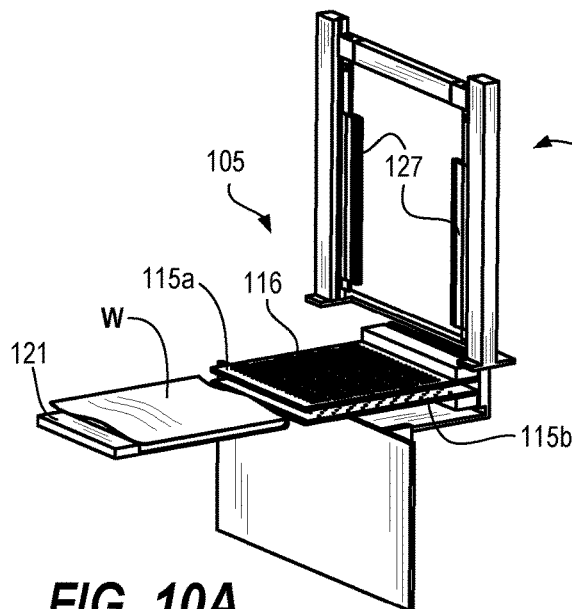
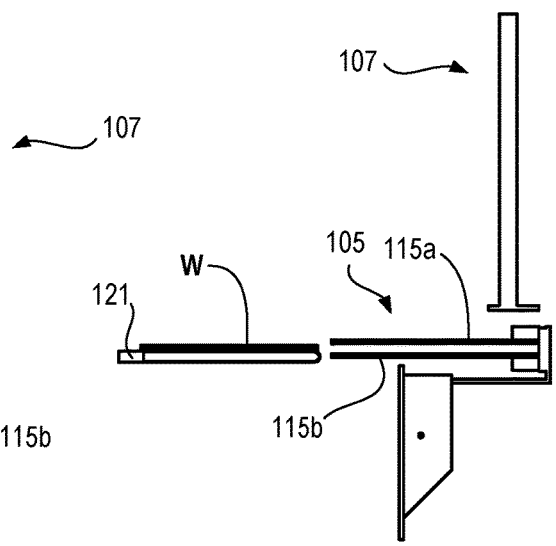
FIG. 10A    FIG. 10B
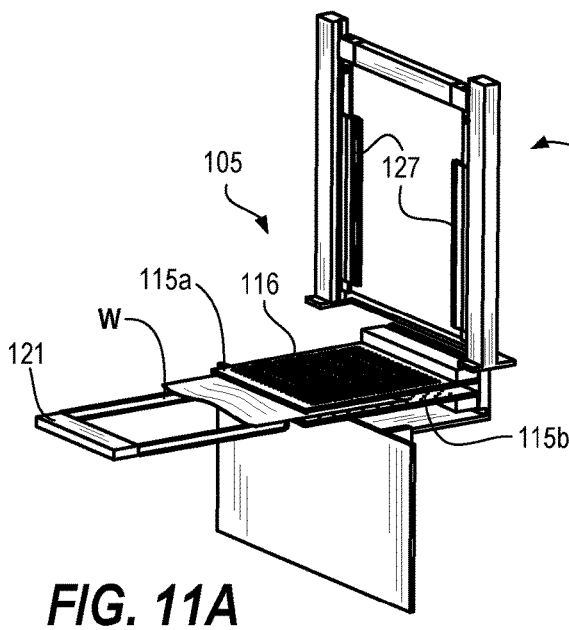
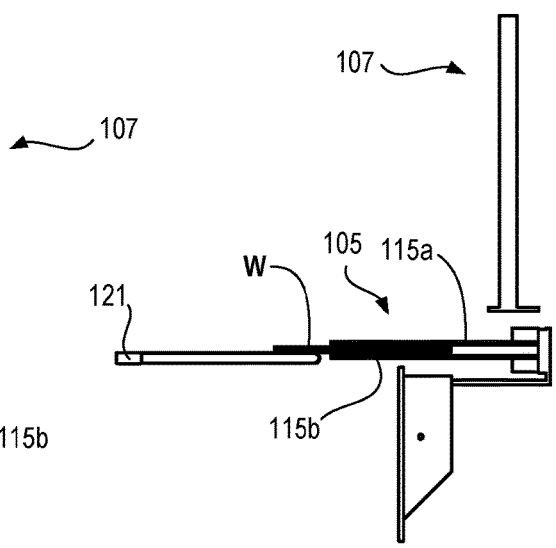
FIG. 11A    FIG. 11B

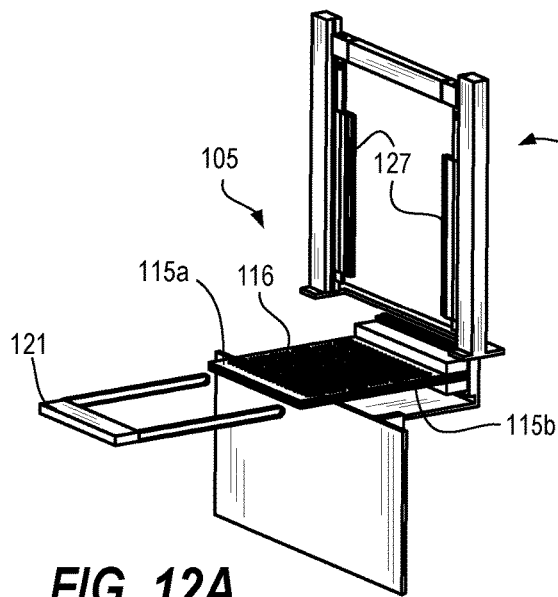
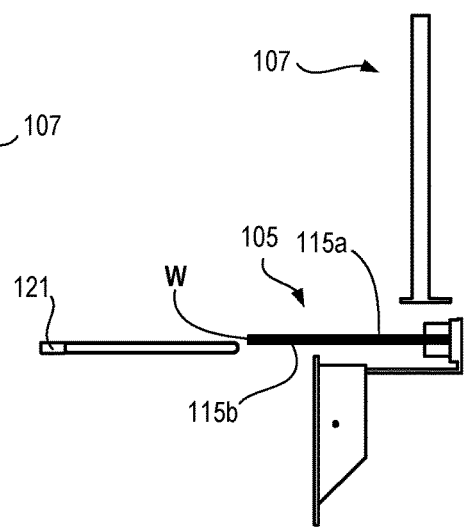
FIG. 12A
FIG. 12B
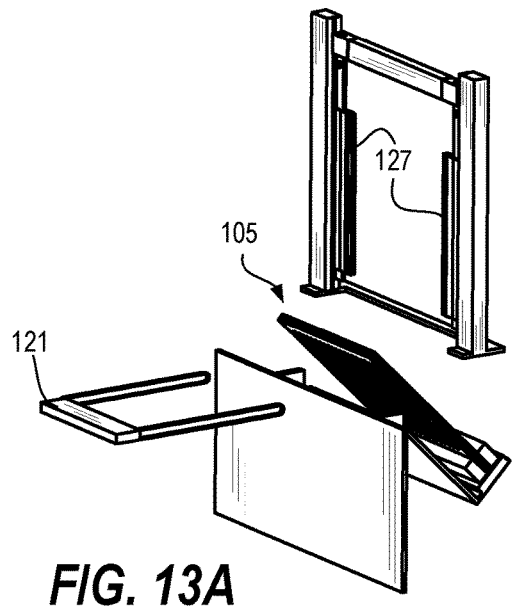
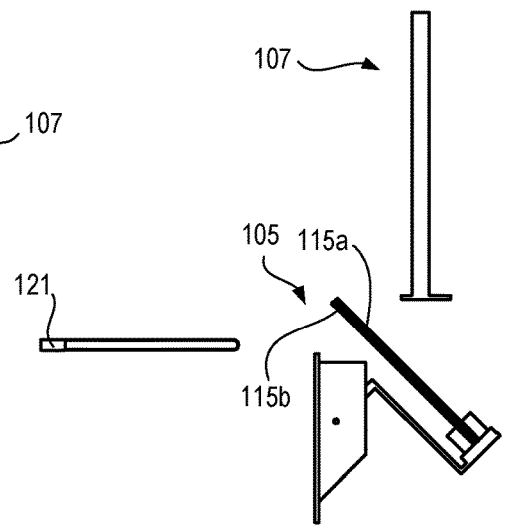
FIG. 13A
FIG. 13B

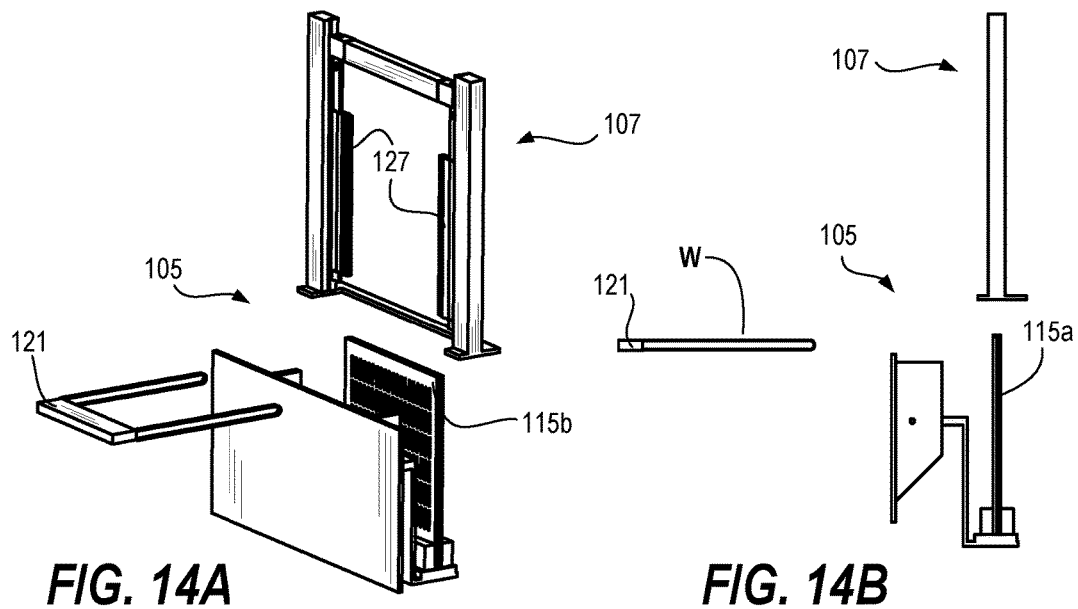
FIG. 14A                    FIG. 14B
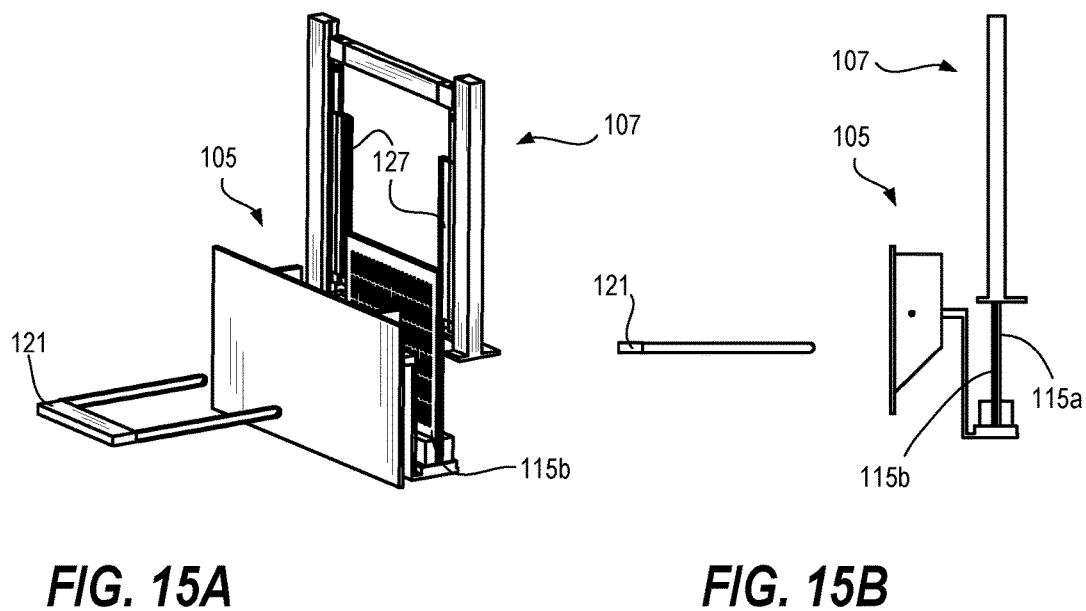
FIG. 15A                    FIG. 15B

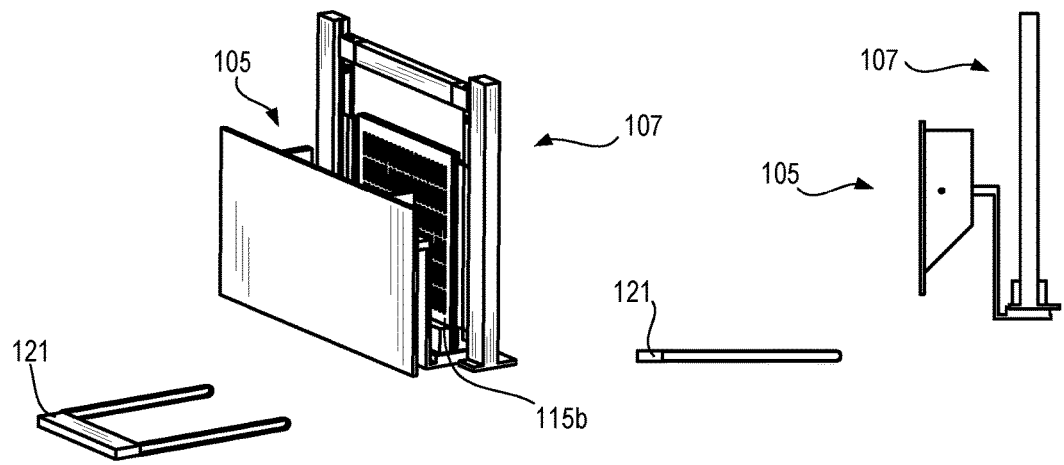
FIG. 16A  FIG. 16B
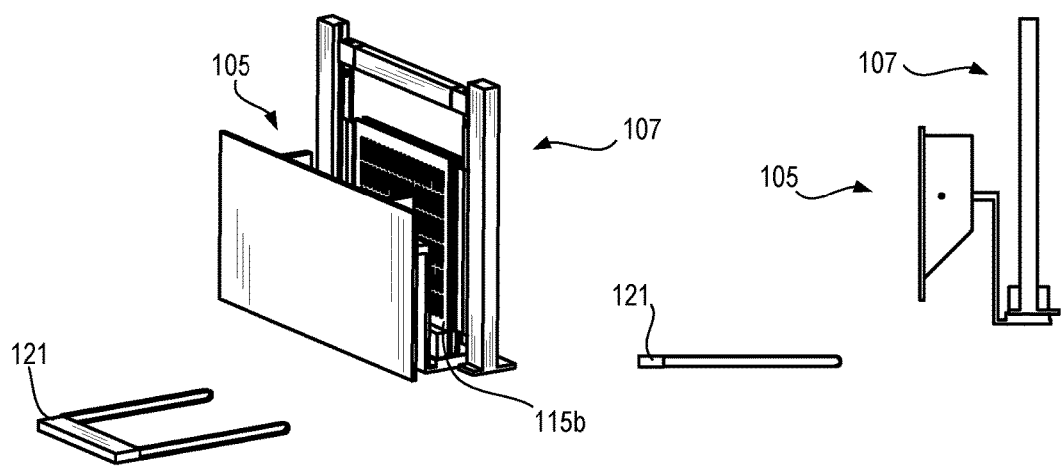
FIG. 17A  FIG. 17B

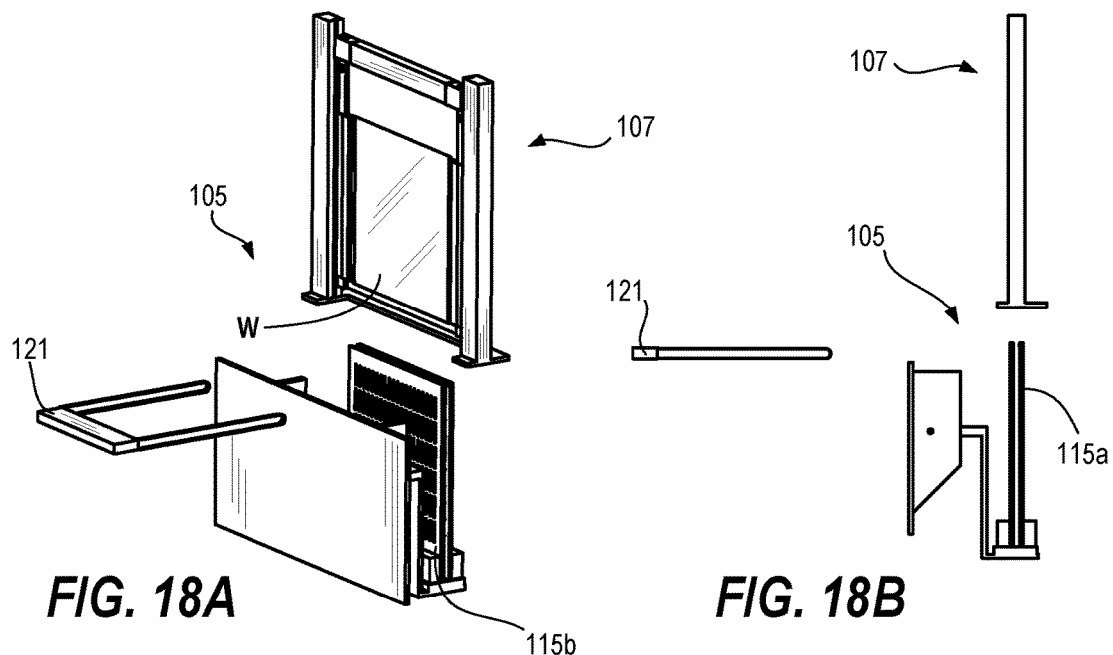
FIG. 18A
FIG. 18B
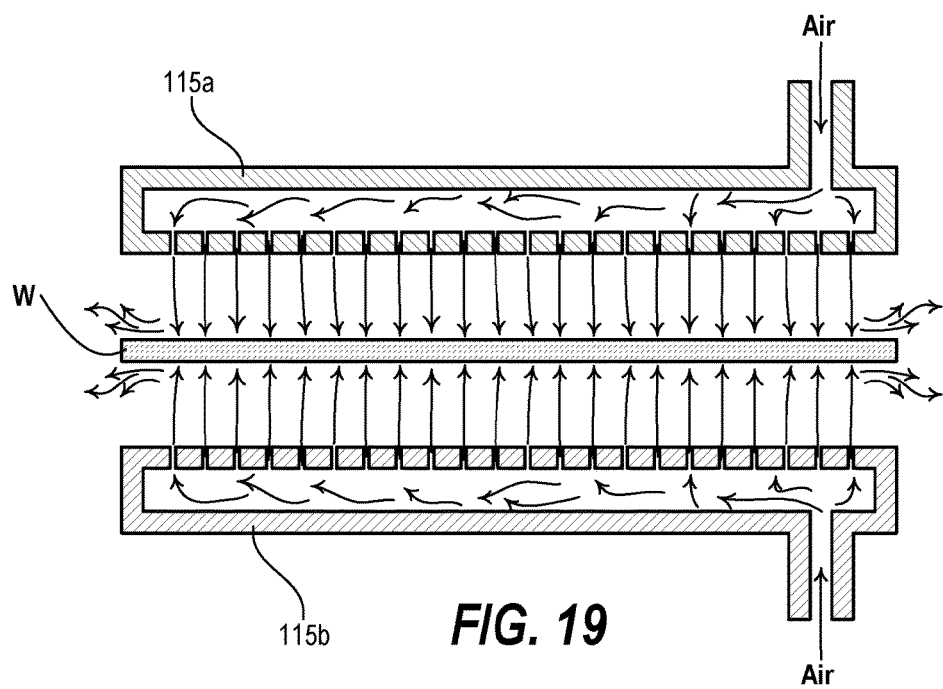
FIG. 19

WORKPIECE LOADER FOR A WET PROCESSING SYSTEM

BACKGROUND OF THE INVENTION

This invention relates to methods and systems for electro-chemical deposition including electroplating of semiconductor substrates. More specifically, this invention relates to systems and methods for holding, handling, and transporting thin substrates.

Electro-chemical deposition, among other processes, is used as a manufacturing technique for the application of films to various structures and surfaces, such as to semiconductor wafers, silicon workpieces or thin panels. Such films can include tin silver, nickel, copper or other metal layers. Electro-chemical deposition involves positioning a substrate within a solution that includes metal ions, and then applying an electrical current to cause metal ions from the solution to be deposited on the substrate. Typically, electrical current flows between two electrodes, namely, between a cathode and an anode. When a substrate is used as the cathode, metal can be deposited thereon. A plating solution can include one or more metal ion types, acids, chelating agents, complexing agents, and any of several other types of additives that assist with plating a particular metal. Deposited metal films can include metal and metal alloys, such as tin, silver, nickel, copper, etc., and alloys thereof.

SUMMARY

Electro-chemical deposition systems typically involve transporting substrates to a tank of plating fluid, plating one or more metals on the substrates via an electrical current, and then removing the substrates from the tank for further processing. Effective transporting and handling of various substrates is beneficial to properly plate substrates and to prevent damage to substrates. Transporting and holding various types of substrates can be challenging depending on substrate size, thickness, flexibility, etc. Two conventional types of substrate geometries include semiconductor wafers, which are characterized by relatively rigid silicon circular disks, and panel type geometries, which are characterized by typically larger and more flexible rectangular shaped substrates.

Techniques herein provide a workpiece handling and loading apparatus that can load, unload and handle/hold relatively flexible and thin substrates for transport and electrochemical deposition. Such a system can, for example, assist with workpiece holder exchange between a delivery cartridge or magazine, and a workpiece holder for subsequent transport. Embodiments include a workpiece handler configured to provide an air cushion to a given workpiece, and maneuvering of the given workpiece to a workpiece holder.

One embodiment includes an apparatus for handling a workpiece. The apparatus includes a loader module having parallel plates. The parallel plates have planar surfaces that face each other. Each planar surface of the parallel plates includes an array of gas outlets. The loader module is configured to receive a flexible workpiece that has opposing planar surfaces. The loader module is configured to position the flexible workpiece between the parallel plates of the loader module such that the opposing planar surfaces of the flexible workpiece face the planar surfaces of the parallel plates. Each of the parallel plates is configured to supply an air cushion sufficient to flatten the flexible workpiece and hold the flexible workpiece between the parallel plates without the flexible workpiece contacting planar surfaces of the parallel plates.

A workpiece holder is configured to be aligned with the loader module. The workpiece holder includes a clamping mechanism configured to be opened sufficiently to receive opposing edges of the flexible workpiece when the loader module is carrying the flexible workpiece. The clamping mechanism is configured to close on the opposing planar surfaces of the flexible workpiece at edges of the flexible workpiece such that the flexible workpiece is held between first and second leg members of the workpiece holder. The workpiece holder is configured to be separated from the loader module.

Another embodiment includes a method of handling a workpiece. A flexible workpiece is positioned between parallel plates of a loader module. The parallel plates have planar surfaces that face each other. Each planar surface of the parallel plates includes an array of gas outlets. The flexible workpiece has opposing planar surfaces. The flexible workpiece is positioned such that the opposing planar surfaces of the flexible workpiece face the planar surfaces of the parallel plates. An air cushion is supplied from each of the parallel plates such that the flexible workpiece is flattened by the air cushion and held between the parallel plates without contacting the planar surfaces of the parallel plates. The loader module is aligned with a workpiece holder such that opposing edges of the flexible workpiece are positioned at a clamping mechanism that is open sufficiently to receive the opposing edges of the flexible workpiece. The clamping mechanism is closed on the opposing planar surfaces of the flexible workpiece at edges of the flexible workpiece such that the flexible workpiece is held between first and second leg members of the workpiece holder. The workpiece holder can be separated from the loader module.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIG. 10A is a perspective view of a workpiece handling apparatus and workpiece holder showing workpiece loading according to embodiments disclosed herein.

FIG. 10B is a side view of a workpiece handling apparatus and workpiece holder showing workpiece loading according to embodiments disclosed herein.

FIG. 11A is a perspective view of a workpiece handling apparatus and workpiece holder showing workpiece loading according to embodiments disclosed herein.

FIG. 11B is a side view of a workpiece handling apparatus and workpiece holder showing workpiece loading according to embodiments disclosed herein.

FIG. 12A is a perspective view of a workpiece handling apparatus and workpiece holder showing workpiece handling according to embodiments disclosed herein.

FIG. 12B is a side view of a workpiece handling apparatus and workpiece holder showing workpiece handling according to embodiments disclosed herein.

FIG. 13A is a perspective view of a workpiece handling apparatus and workpiece holder showing workpiece handling according to embodiments disclosed herein.

FIG. 13B is a side view of a workpiece handling apparatus and workpiece holder showing workpiece handling according to embodiments disclosed herein.

FIG. 14A is a perspective view of a workpiece handling apparatus and workpiece holder showing workpiece handling according to embodiments disclosed herein.

FIG. 14B is a side view of a workpiece handling apparatus and workpiece holder showing workpiece handling according to embodiments disclosed herein.

FIG. 15A is a perspective view of a workpiece handling apparatus and workpiece holder showing workpiece loading according to embodiments disclosed herein.

FIG. 15B is a side view of a workpiece handling apparatus and workpiece holder showing workpiece loading according to embodiments disclosed herein.

FIG. 16A is a perspective view of a workpiece handling apparatus and workpiece holder showing workpiece loading according to embodiments disclosed herein.

FIG. 16B is a side view of a workpiece handling apparatus and workpiece holder showing workpiece loading according to embodiments disclosed herein.

FIG. 17A is a perspective view of a workpiece handling apparatus and workpiece holder showing workpiece loading according to embodiments disclosed herein.

FIG. 17B is a side view of a workpiece handling apparatus and workpiece holder showing workpiece loading according to embodiments disclosed herein.

FIG. 18A is a perspective view of a workpiece handling apparatus and workpiece holder showing workpiece handling according to embodiments disclosed herein.

FIG. 18B is a side view of a workpiece handling apparatus and workpiece holder showing workpiece handling according to embodiments disclosed herein.

FIG. 19 is a schematic cross-sectional view of a workpiece handling apparatus showing a double-sided air cushion according to embodiments disclosed herein.

DETAILED DESCRIPTION

Techniques herein provide a workpiece handling and loading apparatus that can load, unload and handle relatively flexible and thin substrates for transport and electrochemical deposition. Such a system can, for example, assist with workpiece holder exchange between a delivery cartridge or magazine and a workpiece holder. Embodiments include a workpiece handler configured to provide an air cushion to a given workpiece, and maneuvering to a given workpiece holder.

Figure 1:
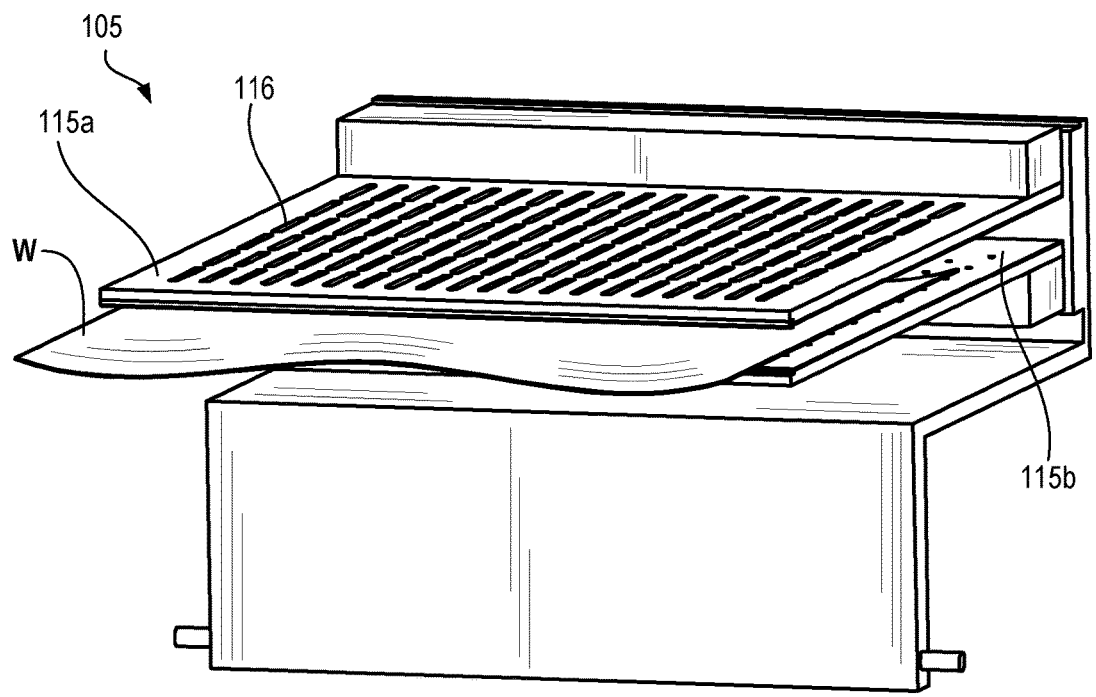
FIG. 1 is a perspective view of a workpiece handling apparatus according to embodiments disclosed herein.

Referring now to FIG. 1, a loader module 105 is generally shown. Loader module 105 is configured to receive, handle, position, and deliver a substrate such as workpiece W. Various different substrates can be used for a particular fabrication process. Some substrates are relatively rigid, which can make handling easier. Other substrates can be comparatively flexible, which can create some challenges with material deposition, material removal, and substrate manipulation. Loader module 105 is configured to handle workpiece W which can be comparatively flexible to semiconductor wafers. A flexible workpiece herein can have over 10 millimeters of flexure in that opposing edges can be moved more than 10 millimeters out of plane compared to each other.

Loader module 105 includes parallel plates 115a and 115b. Parallel plates 115a and 115b have planar surfaces that face each other. Each planar surface of the parallel plates includes an array of gas outlets, such as gas outlets 116. Loader module 105 is configured to receive workpiece W, which can be a flexible workpiece with opposing planar surfaces.

Figure 2:
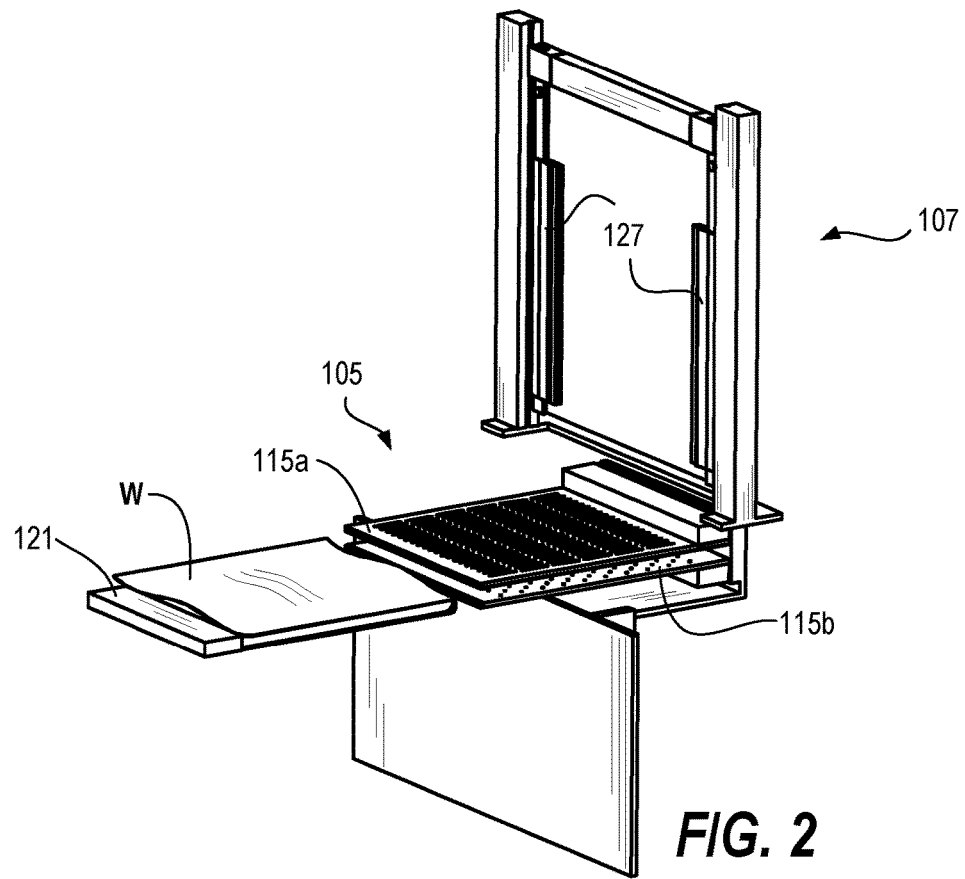
FIG. 2 is a perspective view of a workpiece handling apparatus and workpiece holder according to embodiments disclosed herein.

The loader module 105 is configured to receive workpiece W between the parallel plates of the loader module such that the opposing planar surfaces of the flexible workpiece face the planar surfaces of the parallel plates. FIG. 1 shows workpiece W partially inserted between the parallel plates 115a and 115b. FIG. 2 includes workpiece conveyor 121, which is configured to deliver workpiece W between the parallel plates 115a and 115b. Workpiece conveyor 121 can have various geometric configurations and mechanisms for workpiece delivery and removal. Workpiece conveyor 121 can be part of a larger system for extracting workpieces from a magazine or cartridge of multiple workpieces. Such a magazine, for example, can be transported from another fabrication tool to an electro-chemical deposition system herein for metal plating. In some embodiments, conveying and transport mechanisms herein can use specifications from Surface Mount Equipment Manufacturers Association (SMEMA).

The loader module 105 is configured to position the workpiece W between the parallel plates 115a and 115b of the loader module such that each of the parallel plates is configured to supply an air cushion sufficient to flatten the flexible workpiece and hold the flexible workpiece between the parallel plates without the flexible workpiece contacting planar surfaces of the parallel plates. In other words, each parallel plate can supply a uniform cushion of air so that the workpiece is sandwiched between opposing air cushions or air bearings. By comparison, the game of air hockey typically uses a table that has small holes that supply an air cushion so that an air hockey puck can slide on the table surface with low friction. With systems herein, however, sufficient air is blown or continuously supplied on both sides of a workpiece to largely suspend planar surfaces of the workpiece between the parallel plates without the workpiece contacting the parallel (or having only limited contact with the parallel plates). FIG. 19 illustrates a schematic representation of this mechanism. Note in FIG. 19 that workpiece W is suspended between the parallel places. By maintaining the workpiece positioned between two cushions of air, opportunities for workpiece defects are lessened by reducing potential for physical contact with the workpiece surface, which prevents potential damage to transistors, integrated circuits, etc.

The loader module 105 is configured to be aligned with a workpiece holder 107. Workpiece holder 107 is configured to be aligned with the loader module 105. The workpiece holder 107 includes a clamping mechanism 127 configured to be opened sufficiently to receive opposing edges of the workpiece W when the loader module 105 is carrying the workpiece W. The clamping mechanism 127 is configured to close on the opposing planar surfaces of the workpiece at edges of the workpiece such that the workpiece is held between first and second leg members of the workpiece holder 107. The workpiece holder 107 is configured to be separated from the loader module 105, such as for transporting a given workpiece to and into a deposition tank.

Components of the system and methods of use will now be described in more detail with reference to the subsequent drawings.

Figure 3A:
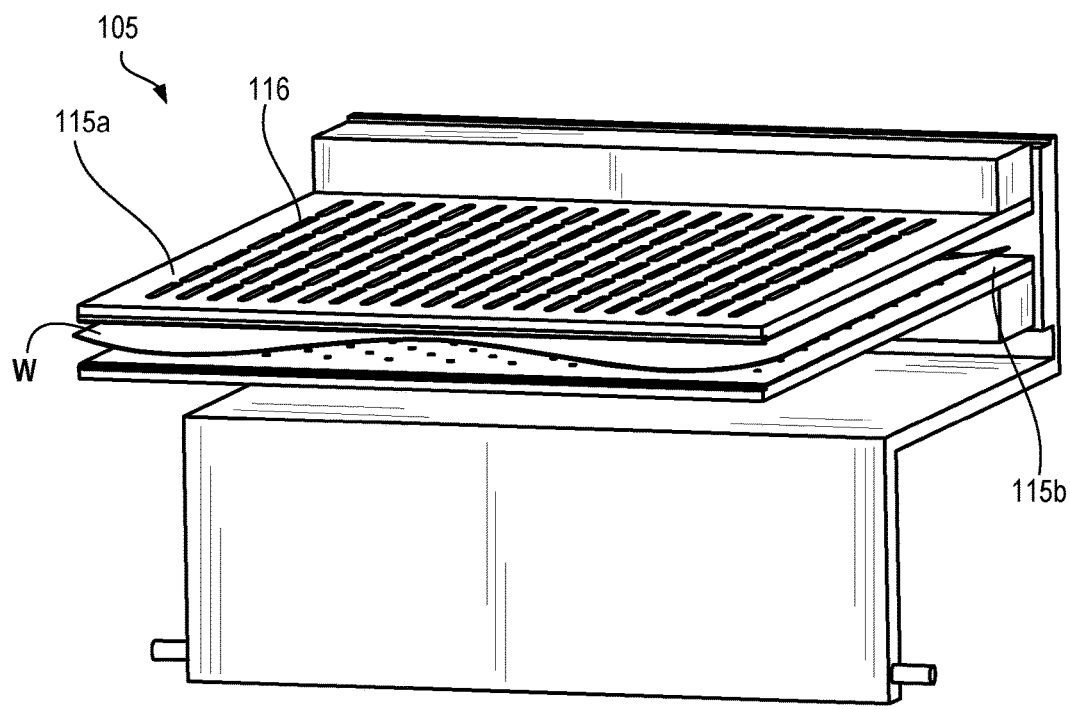
FIG. 3A is a perspective view of a workpiece handling apparatus according to embodiments disclosed herein.
Figure 3B:
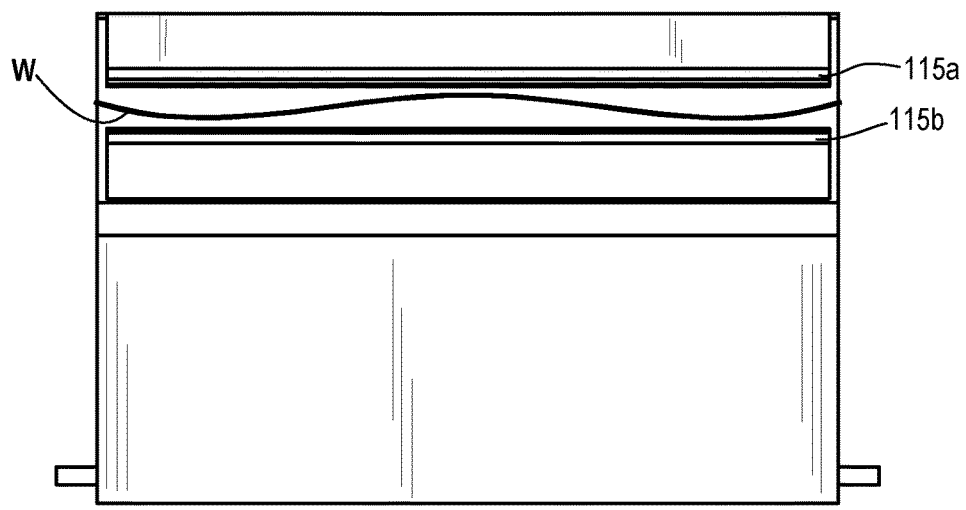
FIG. 3B is a front view of a workpiece handling apparatus according to embodiments disclosed herein.

FIGS. 3-5 illustrate flattening and positioning of a given workpiece within the loader module. FIG. 3A is a perspective view of loader module 105, while FIG. 3B is a front view of the loader module 105. As can be seen, workpiece W has been inserted between parallel plates 115a and 115b. Note that workpiece W is depicted as being somewhat wavy to illustrate the flexibility of such workpieces. Workpieces can have various thicknesses. Some workpieces can range between 0.2 mm to 2.0 mm or more. Thicknesses of 4 millimeters and below can be handled herein. Depending on material type and workpiece thickness, given workpieces can have various degrees of flexibility. Some workpieces can be embodied as a rectangular panel.

The loader module 105 is configured to receive the workpiece between the parallel plates via a conveyor configured to mechanically move the workpiece into the loader module. The loader module is also configured to mechanically move the flexible workpiece into the loader module via a cushion of air. Thus, during delivery of a workpiece into the loader module, the cushion of air can optionally be used to assist with sliding the workpiece into place. In some embodiments, pneumatic bumpers (not shown) are configured to align the workpiece within the loader module. The loader module can include an edge support member positioned to support at least one edge of the flexible workpiece when the flexible workpiece is being aligned or floated into position between the parallel plates.

Either before workpiece insertion or after workpiece insertion between the parallel plates, gas flow can be initiated to flow air through the array of gas outlets of each planar surface of the parallel plates to provide the air cushion (double-sided air cushion). A given gas flow rate and pressure can be based on workpiece characteristics such as weight, thickness, flexibility, etc. The array of gas outlets of each planar surface of the parallel plates can be configured to supply sufficient air pressure to flatten the flexible workpiece to less than 2 millimeters of flexure (non planarity) or otherwise depending on the requirements of a particular electro-chemical deposition (ECD) process.

Figure 4A:
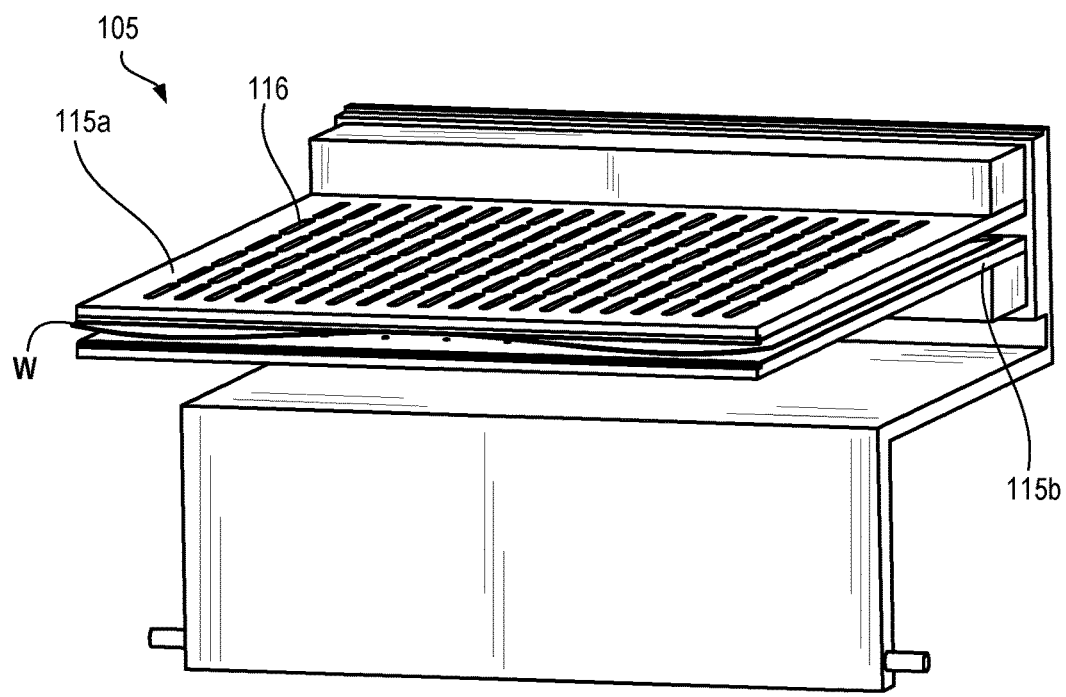
FIG. 4A is a perspective view of a workpiece handling apparatus according to embodiments disclosed herein.
Figure 4B:
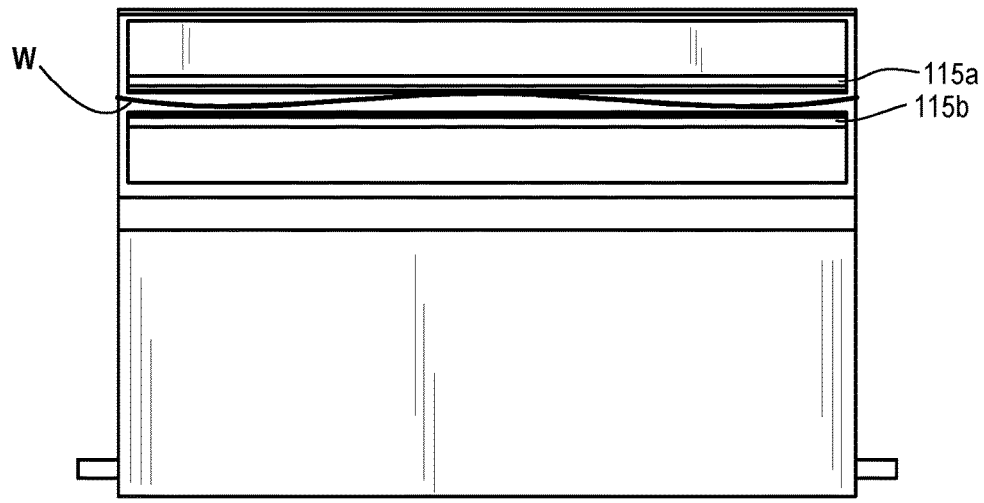
FIG. 4B is a front view of a workpiece handling apparatus according to embodiments disclosed herein.
Figure 5A:
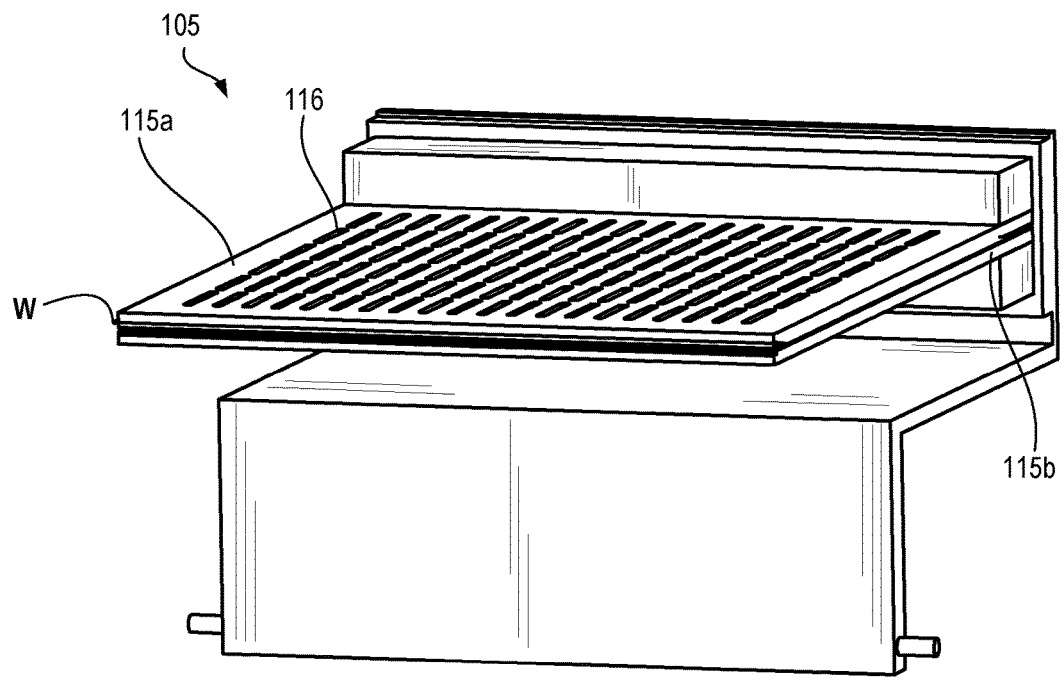
FIG. 5A is a perspective view of a workpiece handling apparatus according to embodiments disclosed herein.
Figure 5B:
FIG. 5B is a front view of a workpiece handling apparatus according to embodiments disclosed herein.

The loader module 105 is configured to shorten a distance between the parallel plates when supplying the air cushion. In FIGS. 4A and 4B, the parallel plates are illustrated has having been moved closer together, while reducing flexure in the workpiece W. The parallel plates can be moved toward each other until reaching a desired tolerance or flatness of the workpiece. FIGS. 5A and 5B illustrate that the workpiece W has been straightened to be more planar than when initially received in the loader module 105. The parallel plates can include supports positioned on a workpiece receiving edge of the parallel plates and configured to maintain a predetermined gap distance between the parallel plates. In other words, an edge or lip on at least one of the parallel plates can come in contact with the opposing parallel plate. This prevents variation in plate separation distance while moving the loader module thereby protecting the workpiece from accidental contact.

The parallel plates can have a plate width that is less than a workpiece width of the flexible workpiece such that when the flexible workpiece is positioned in the loader module, the opposing edges of the flexible workpiece extend beyond opposing edges of each parallel plate. In FIG. 5B such a result is illustrated as workpiece W can be seen as extending beyond a width of the parallel plates 115a and 115b.

Figure 6:
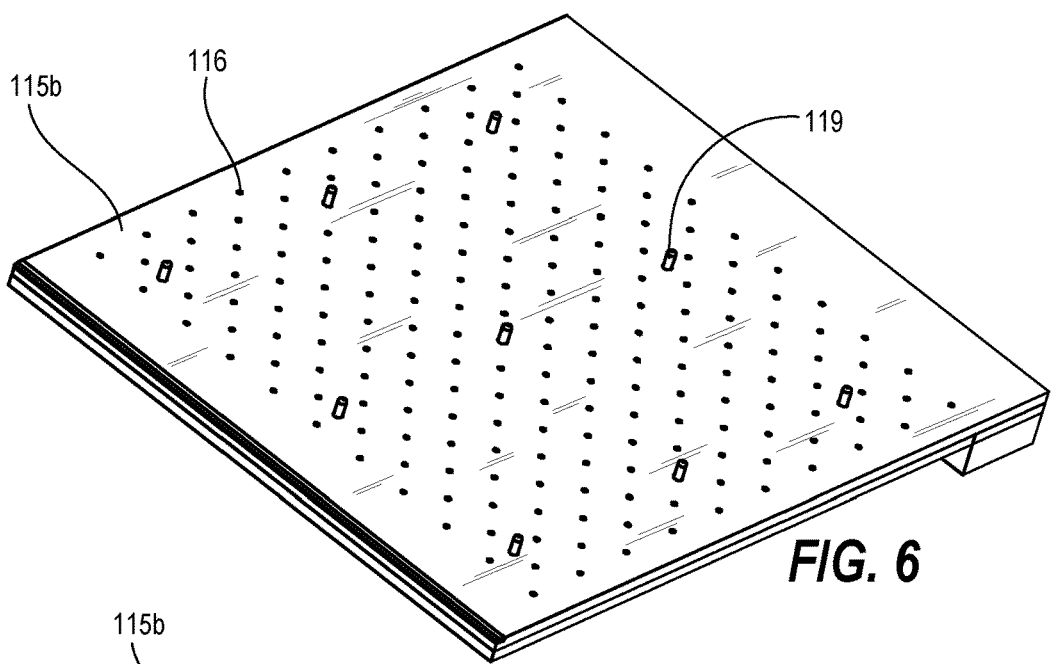
FIG. 6 is a perspective view of a workpiece handling plate according to embodiments disclosed herein.
Figure 7:
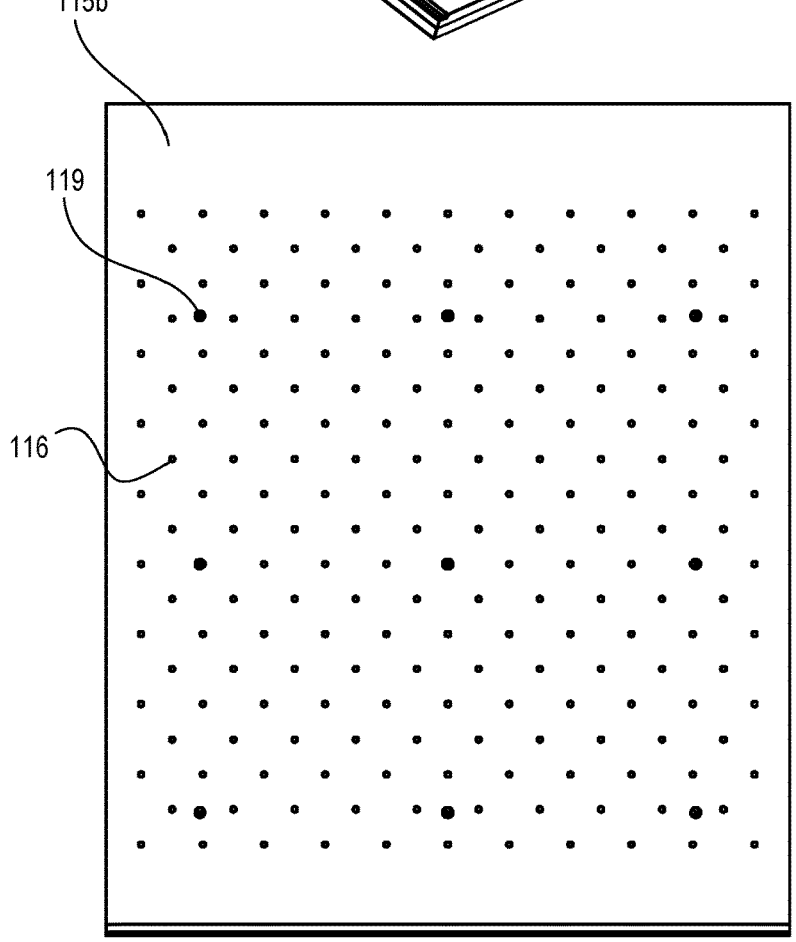
FIG. 7 is a top view of a workpiece handling plate according to embodiments disclosed herein.
Figure 8:
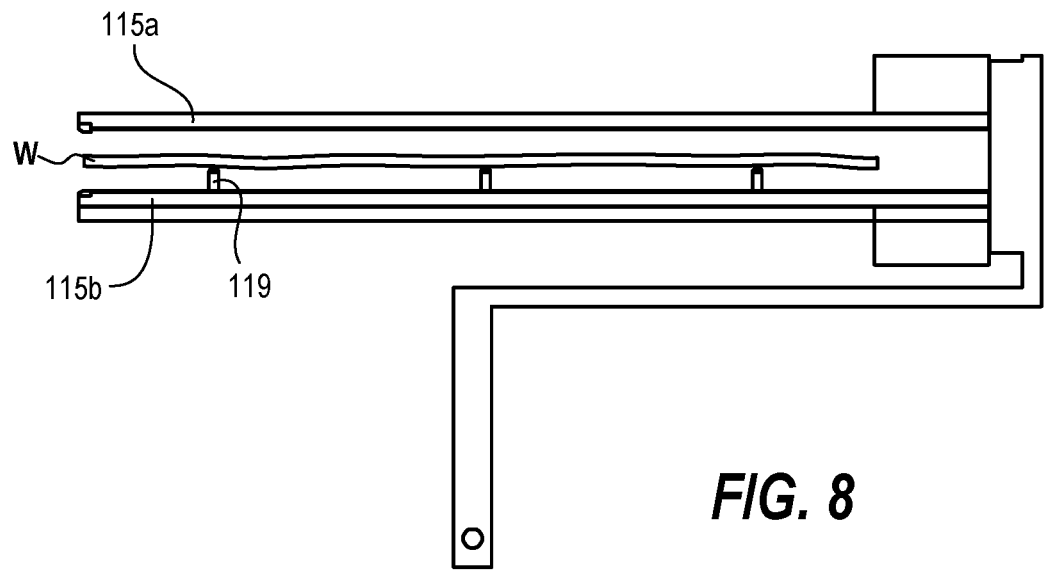
FIG. 8 is a side view of a workpiece handling apparatus according to embodiments disclosed herein.
Figure 9:
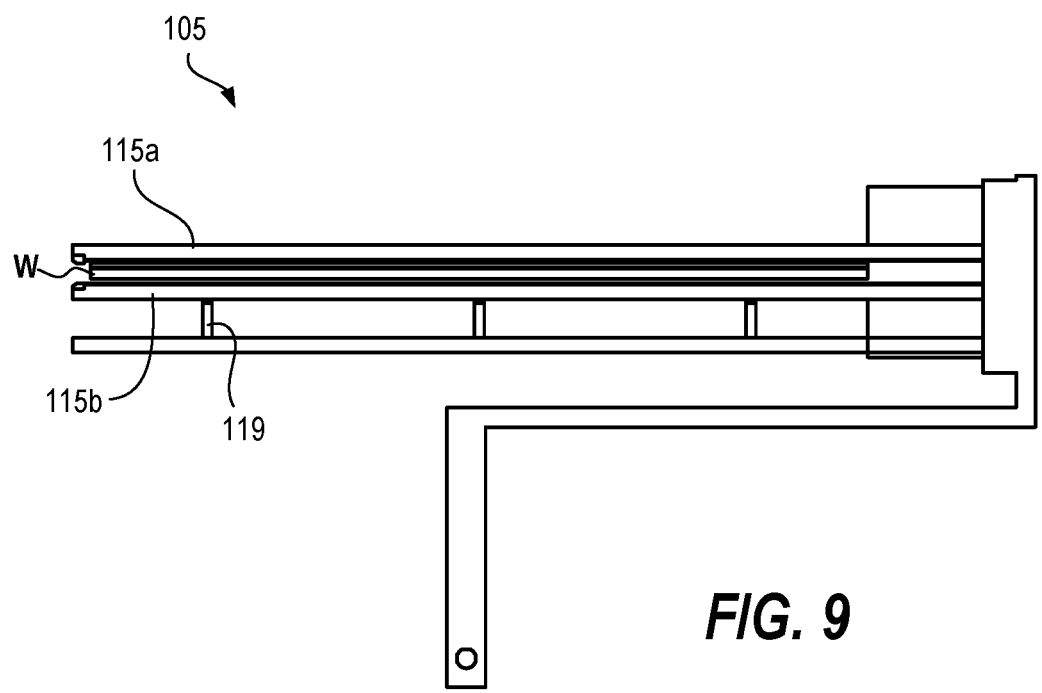
FIG. 9 is a side view of a workpiece handling apparatus according to embodiments disclosed herein.

FIG. 6 and FIG. 7 illustrate an example parallel plate 115b. An array of gas outlets can be seen depicted as holes. Various shapes of openings can be used for the gas outlets. In some embodiments, lift pins 119 can be included, with the parallel plates moving independent of the lift pins 119. The lift pins 119 can optionally be used to hold the workpiece W prior to moving the parallel plates together and/or initiating the air cushion. FIG. 8 shows workpiece W resting on lift pins 119. FIG. 9 shows the loader module 105 after the parallel plates have been moved together, such that the lift pins 119 remaining below. At this point, the working surfaces of the workpiece W are supported only by the cushion of air, though at least one edge of the workpiece W can be in contact with the loader module to prevent the workpiece W from sliding out when the loader module is pivoted. Thus, multiple lift pins can be configured to protrude through a given parallel plate (one or the other or both). The multiple lift pins are positioned to receive the workpiece between the parallel plates, such as to be rested on, and then be removed from contact with the workpiece when supplying the air cushion. The lift pins can be configured to receive the substrate prior to deposition, or after deposition. The lift pins can be removed from contact with the workpiece by bringing the parallel plates together as the pins remain stationary, and/or the pins can have an actuator to actively lower the pins out of the space between the parallel plates.

FIGS. 10-18 illustrate a process of receiving a workpiece into a loader module, maneuvering the workpiece to a workpiece holder and then receiving and returning the workpiece. In FIGS. 10-18, figure numbers with the letter "A" depict perspective views, while figure numbers with the letter "B" depict a corresponding side view.

FIGS. 10A-10B are like FIG. 2 and include workpiece conveyor 121, which is configured to deliver workpiece W between the parallel plates 115a and 115b of loader module 105. In FIGS. 11A-11B, workpiece W is being inserted between parallel plates 115a and 115b. Any of various conveyor mechanisms can be used. The air cushion can also be activated during delivery of the workpiece W to assist with movement. In FIGS. 12A-12B, the workpiece W is fully positioned between the parallel plates, with a cushion of air being supplied to prevent physical contact with the working surface(s) of the workpiece.

In FIGS. 13A-B, loader module 105 begins pivoting the parallel plates. In FIGS. 14A-B, the parallel plates have completed moving to a vertical position underneath the workpiece holder 107. In FIGS. 15A-15B the loader module moves toward the workpiece holder. Note that either the loader module can transport the workpiece, or the workpiece holder can be moved into place, or a combination of both. FIGS. 16A-B illustrate the workpiece being maneuvered between legs of the workpiece holder 107. Thus, the loader module 105 can be configured to be pivoted or otherwise moved to hold the flexible workpiece in a vertical position and aligned with the workpiece holder.

Prior to aligning the loader module with the workpiece holder, a clamping mechanism of the workpiece holder can be opened to provide space for receiving the workpiece. A pneumatic bladder can be positioned to open the clamping mechanism. Each leg or leg member of the workpiece holder can include an elastic clamping mechanism. The elastic clamping mechanism can include opposing flexible members mounted such that the opposing flexible members provide an opposing clamping force against each other. The clamping mechanism can also include clamping contacts that are electrically conductive. The clamping contacts include a surrounding seal such that when the clamping mechanism is closed on the flexible workpiece the surrounding seal seals the clamping contacts from liquid entry.

With opposing edges of the workpiece W positioned within each clamping mechanism of the workpiece holder 107, the clamping mechanism can be configured to close on corresponding edges of the workpiece. For example, the pneumatic bladder is deflated to close the clamping mechanism to clamp on edges of the workpiece. With the workpiece clamped and held by the workpiece holder, the parallel plates can be separated from each other such as to have clearance when moving the loader module and workpiece holder away from each other without accidentally contacting the workpiece.

In some embodiments, the workpiece holder can optionally include a tensioner within a header member. The header member couples first and second leg members of the workpiece holder. The tensioner can be configured to receive a compressive force prior to the clamping mechanism closing, and then the tensioner is configured to exert a tensile force to the flexible workpiece subsequent to the clamping mechanism closing on the flexible workpiece. A more detailed description of an example workpiece holder is found in U.S. patent application Ser. No. 15/193,595, filed on Jun. 27, 2016, which is herein incorporated by reference in its entirety.

With the workpiece firmly clamped, the workpiece holder can be lifted upwardly or otherwise from the loader module, as shown in FIGS. 18A-18B. At this point, the workpiece holder can transport the workpiece to one or more electrochemical deposition (ECD) tanks for electroplating the substrate. Upon completing a given ECD process or processes, the processed workpiece can then be transported to the loader module, with the above-described steps reversed to return a processed workpiece to a cartridge or magazine.

Techniques herein can also include methods of handling a workpiece. A flexible workpiece is positioned between parallel plates of a loader module. The parallel plates have planar surfaces that face each other. Each planar surface of the parallel plates includes an array of gas outlets. The flexible workpiece has opposing planar surfaces. The flexible workpiece is positioned such that the opposing planar surfaces of the flexible workpiece face the planar surfaces of the parallel plates. An air cushion is supplied from each of the parallel plates such that the flexible workpiece is flattened by the air cushion and held between the parallel plates without contacting the planar surfaces of the parallel plates.

The loader module is aligned with a workpiece holder such that opposing edges of the flexible workpiece are positioned at a clamping mechanism that is open sufficiently to receive the opposing edges of the flexible workpiece. The clamping mechanism is closed on the opposing planar surfaces of the flexible workpiece at edges of the flexible workpiece such that the flexible workpiece is held between first and second leg members of the workpiece holder. The workpiece holder is then separated from the loader module.

In other embodiments, supplying the air cushion includes flowing gas through the array of gas outlets of each planar surface of the parallel plates. Flowing gas through the array of gas outlets of each planar surface of the parallel plates can include supplying sufficient air pressure to flatten the flexible workpiece to less than 2 millimeters of flexure.

The parallel plates can have a plate width that is less than a workpiece width of the flexible workpiece such that the opposing edges of the flexible workpiece extend beyond opposing edges of each parallel plate. Supplying the air cushion can further comprise shortening a distance between the parallel plates until supports on the parallel plates contact each other, with supports positioned on workpiece receiving edge of the parallel plates. Supplying the air cushion can include providing pneumatic bumpers that align the flexible workpiece within the loader module. Aligning the loader module with the workpiece holder can include pivoting the loader module such that the flexible workpiece is held in a vertical position.

In some embodiments, prior to aligning the loader module with the workpiece holder, the clamping mechanism is opened. Opening the clamping mechanism can include using pneumatic bladder inflation. Aligning the loader module with the workpiece holder can include applying a compressive force to a tensioner within a header member that couples the first and second leg members. The compressive force can be released after closing the clamping mechanism such that the flexible workpiece is held in tension between the first and second leg members. The clamping mechanism can include the first and second leg members each having an elastic clamping mechanism. The elastic clamping mechanism can include opposing flexible members mounted such that the opposing flexible members provide an opposing clamping force against each other. The loader module can include an edge support member positioned to support at least one edge of the flexible workpiece during alignment.

The clamping mechanism can include clamping contacts that are electrically conductive and can include a surrounding seal such that closing the clamping mechanism on the flexible workpiece includes sealing the clamping contacts from liquid entry. Closing the clamping mechanism can include deflating a pneumatic bladder used to hold the clamping mechanism open. Positioning the flexible workpiece between the parallel plates can include using a conveyor to mechanically move the flexible workpiece into the loader module. Positioning the flexible workpiece between the parallel plates can include using a cushion of air to float the flexible workpiece into the loader module. The flexible workpiece can be a rectangular thin panel having a thickness less than 4 millimeters. Separating the workpiece holder from the loader module can include lifting the workpiece holder upwardly. Separating the workpiece holder from the loader module includes increasing a distance between the parallel plates such that the flexible workpiece can pass between supports positioned on workpiece receiving edge of the parallel plates.

Accordingly, technique herein provide systems and methods for handling wafers, thin panels, and other substrates for loading, unloading, and transporting workpieces.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. An apparatus for handling a workpiece, the apparatus comprising:

a loader module having parallel plates, the parallel plates having planar surfaces that face each other, each planar surface of the parallel plates including an array of gas outlets, the loader module configured to receive a workpiece that has opposing planar surfaces, the loader module configured to position the workpiece between the parallel plates of the loader module such that the opposing planar surfaces of the workpiece face the planar surfaces of the parallel plates;

each of the parallel plates configured to supply an air cushion sufficient to flatten the workpiece and hold the workpiece between the parallel plates without the workpiece contacting planar surfaces of the parallel plates;

the loader module is configured to be aligned with a workpiece holder, the workpiece holder including a clamping mechanism configured to be opened sufficiently to receive opposing edges of the workpiece when the loader module is carrying the workpiece;

the clamping mechanism configured to close on the opposing planar surfaces of the workpiece at edges of the workpiece such that the workpiece is held between first and second leg members of the workpiece holder; and the workpiece holder configured to be separated from the loader module.

2. The apparatus of claim 1, wherein the loader module is configured to flow gas through the array of gas outlets of each planar surface of the parallel plates to provide the air cushion.

3. The apparatus of claim 2, wherein the array of gas outlets of each planar surface of the parallel plates is configured to supply sufficient air pressure to flatten the workpiece to less than 2 millimeters of flexure, the workpiece being a flexible workpiece.

4. The apparatus of claim 1, wherein the parallel plates have a plate width that is less than a workpiece width of the workpiece such that when the workpiece is positioned in the loader module, the opposing edges of the workpiece extend beyond opposing edges of each parallel plate.

5. The apparatus of claim 1, wherein the loader module is configured to shorten a distance between the parallel plates when supplying the air cushion, the parallel plates including supports positioned on a workpiece receiving edge of the parallel plates and are configured to maintain a predetermined gap distance between the parallel plates.

6. The apparatus of claim 1, further comprising pneumatic bumpers configured to align the workpiece within the loader module.

7. The apparatus of claim 1, wherein the loader module is configured to be pivoted and hold the workpiece in a vertical position and aligned with the workpiece holder.

8. The apparatus of claim 1, further comprising multiple lift pins configured to protrude through a given parallel plate, the multiple lift pins positioned to receive the workpiece between the parallel plates, and be removed from contact with the workpiece when supplying the air cushion.

9. The apparatus of claim 1, further comprising a pneumatic bladder positionable to open the clamping mechanism, wherein the clamping mechanism is configured to be opened prior to aligning the loader module with the workpiece holder.

10. The apparatus of claim 1, wherein the workpiece holder includes a tensioner within a header member, the header member coupling first and second leg members of the workpiece holder, the tensioner configured to receive a compressive force prior to the clamping mechanism closing, and the tensioner configured to exert a tensile force to the workpiece subsequent to the clamping mechanism closing on the workpiece.

11. The apparatus of claim 1, wherein the clamping mechanism includes the first and second leg members each having an elastic clamping mechanism.

12. The apparatus of claim 11, wherein the elastic clamping mechanism includes opposing flexible members mounted such that the opposing flexible members provide an opposing clamping force against each other.

13. The apparatus of claim 1, wherein the loader module includes an edge support member positioned to support at least one edge of the workpiece when the workpiece is being aligned.

14. The apparatus of claim 1, wherein the clamping mechanism includes clamping contacts that are electrically conductive, the clamping contacts including a surrounding seal such that when the clamping mechanism is closed on the workpiece the surrounding seal sealing the clamping contacts from liquid entry.

15. The apparatus of claim 1, further comprising a pneumatic bladder configured to be deflated to close the clamping mechanism.

16. The apparatus of claim 1, wherein the loader module is configured to receive the workpiece between the parallel plates via a conveyor configured to mechanically move the workpiece into the loader module.

17. The apparatus of claim 1, wherein the loader module is configured to receive the workpiece between the parallel plates via a cushion of air configured to mechanically move the workpiece into the loader module.

18. The apparatus of claim 1, wherein the workpiece is a rectangular thin panel having a thickness less than 4 millimeters.

19. The apparatus of claim 1, wherein the workpiece holder is configured to be lifted upwardly from the loader module.

20. The apparatus of claim 19, wherein the parallel plates are configured to be separated from each other when lifting the workpiece holder from the loader module.

* * * * *